(12) United States Patent
Han et al.

(10) Patent No.: US 8,119,030 B2
(45) Date of Patent: Feb. 21, 2012

(54) THULIUM-CONTAINING FLUORESCENT SUBSTANCE FOR WHITE LIGHT EMITTING DIODE AND MANUFACTURING METHOD THEREOF

(75) Inventors: Sang-hyuk Han, Hwasung-si (KR); Jae-seob Hwang, Siheung-si (KR); Il-ji Lim, Seoul (KR)

(73) Assignee: Daejoo Electronic Materials Co., Ltd., Kyunggi-Do (KR)

( * ) Notice: Subject to any disclaimer, the term of this patent is extended or adjusted under 35 U.S.C. 154(b) by 513 days.

(21) Appl. No.: 12/305,735

(22) PCT Filed: Jun. 5, 2007

(86) PCT No.: PCT/KR2007/002723
§ 371 (c)(1),
(2), (4) Date: Jan. 6, 2009

(87) PCT Pub. No.: WO2007/148880
PCT Pub. Date: Dec. 27, 2007

(65) Prior Publication Data
US 2010/0163797 A1    Jul. 1, 2010

(30) Foreign Application Priority Data

Jun. 21, 2006 (KR) .................. 10-2006-0055876
Apr. 13, 2007 (KR) .................. 10-2007-0036378

(51) Int. Cl.
*C09K 11/08* (2006.01)
*C09K 11/66* (2006.01)
*C09K 11/02* (2006.01)
*C09K 11/77* (2006.01)

(52) U.S. Cl. .................... 252/301.4 F; 252/301.4 R
(58) Field of Classification Search ............ 252/301.4 F, 252/301.6 F, 301.4 R
See application file for complete search history.

(56) References Cited

U.S. PATENT DOCUMENTS

| 6,093,346 | A  | * | 7/2000  | Xiao et al. .............. 252/301.4 F |
| 6,809,347 | B2 |   | 10/2004 | Tasch et al. |
| 7,045,826 | B2 |   | 5/2006  | Kim et al. |
| 2006/0012284 | A1 | | 1/2006 | Kim et al. |
| 2006/0028122 | A1 | | 2/2006 | Wang et al. |

FOREIGN PATENT DOCUMENTS

| KR | 10-2001-0026297 | A | 4/2001 |
| KR | 100425749 | B1 | 3/2004 |
| KR | 2004-097949 | A1 | 11/2004 |
| KR | 1020040092624 | A | 11/2004 |
| KR | 1020040092625 | A | 11/2004 |
| KR | 2001-0026297 | * | 4/2011 |
| WO | 2004-056939 | A1 | 7/2004 |
| WO | 2004-097949 | A1 | 11/2004 |

OTHER PUBLICATIONS

Katsumata. Trap Levels in Eu-Doped SrAl2O4 phosphor crystals co-doped with rare earth elements. J Am. Ceram. Soc. 89 932-936. Mar. 2, 2006.*

* cited by examiner

Primary Examiner — Carol M Koslow
Assistant Examiner — Matthew Hoban
(74) Attorney, Agent, or Firm — Sughrue Mion, PLLC

(57) ABSTRACT

Disclosed is a thulium-containing fluorescent substance for a white light emitting diode represented by a following chemical formula 1, (Chemical Formula 1) $(M1-X-J7Eu_xTnI_y)_2SiO_4$ where M is a divalent cation metal including Sr or Ba, with $0.005<x<0.05$ and $0.005<y<0.05$. The silicate-based yellow fluorescent substance according to the present invention is sufficiently excited by a blue light source generated by a blue LED to exhibit a yellow emission, with superior luminous intensity, due to the addition of europium oxide ($Eu_2O_3$) and thulium oxide ($Tm_2O_3$) as an activator, thereby being suitable for a white LED.

4 Claims, 3 Drawing Sheets

[Figure 1]
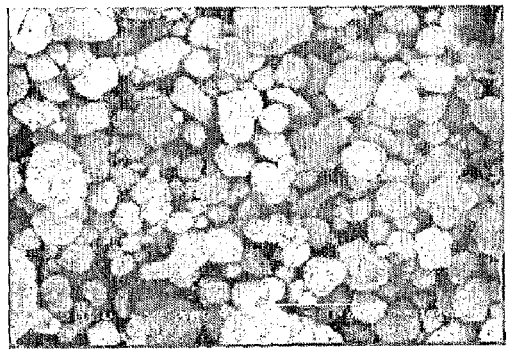
[Figure 2]
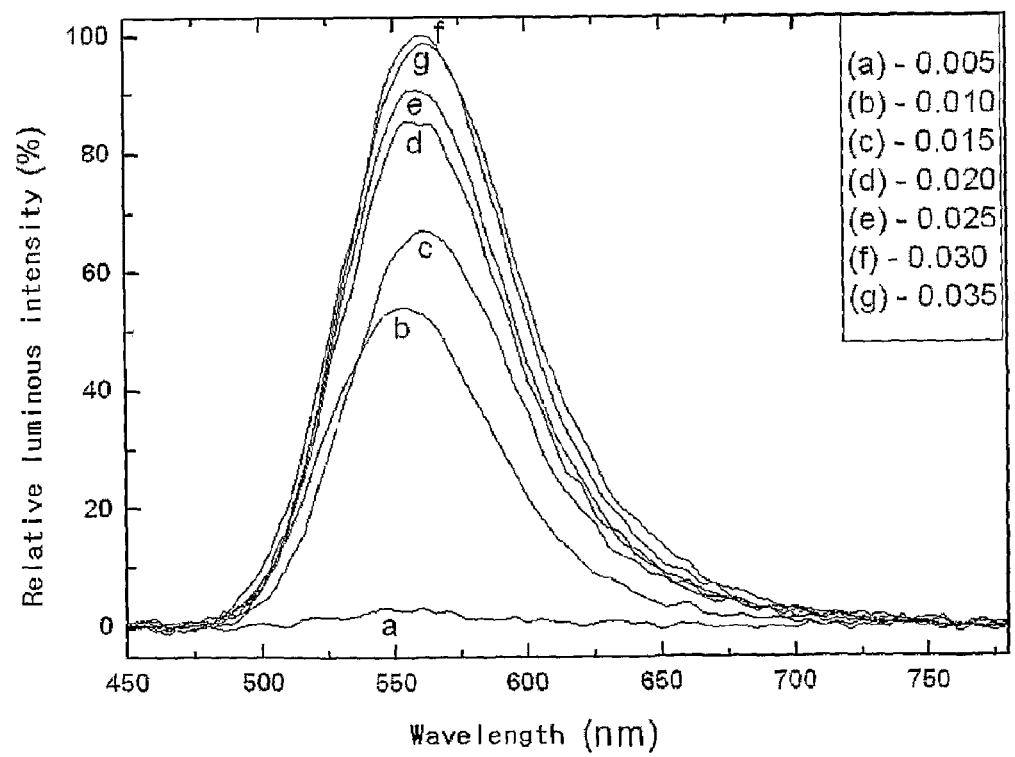

[Figure 3]
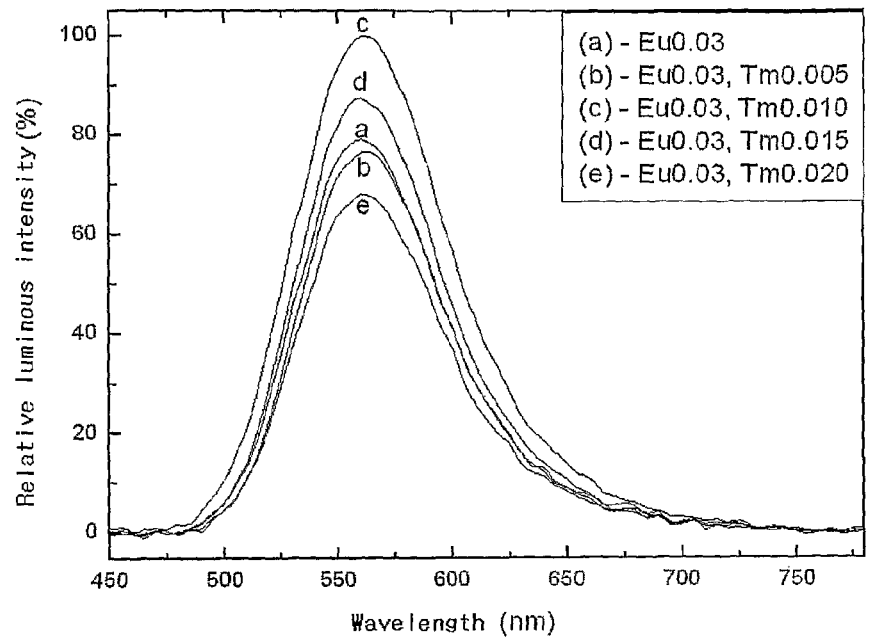
[Figure 4]
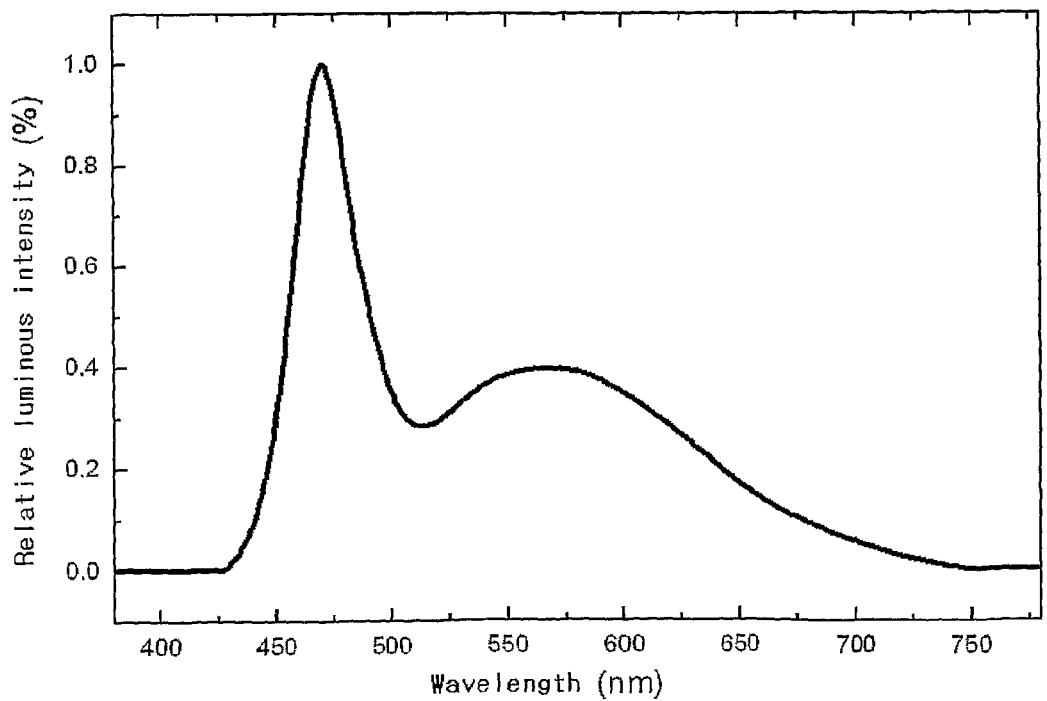

[Figure 5]
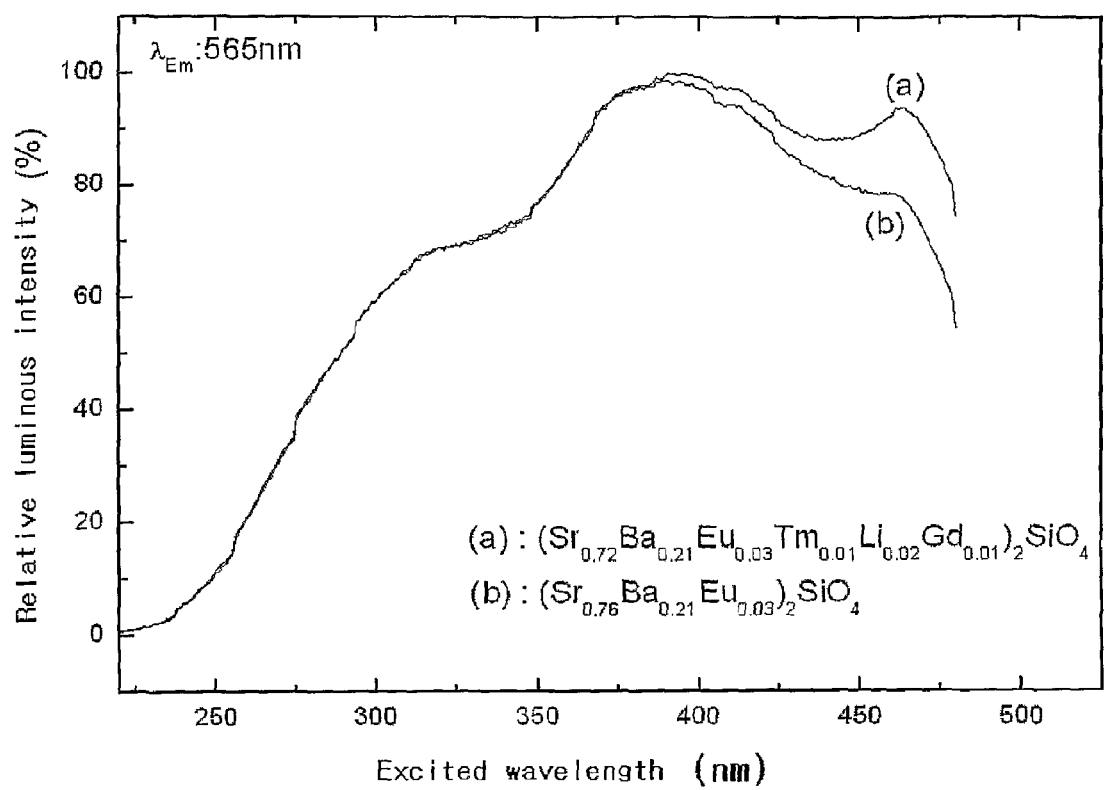

THULIUM-CONTAINING FLUORESCENT SUBSTANCE FOR WHITE LIGHT EMITTING DIODE AND MANUFACTURING METHOD THEREOF

This is a national stage application under 35 U.S.C. §371 of PCT/KR2007/002723 filed on Jun. 5, 2007, which claims priority from Korean patent application 10-2006-0055876 filed on Jun. 21, 2006 and from Korean patent application 10-2007-0036378 filed on Apr. 13, 2007, all of which are incorporated herein by reference.

TECHNICAL FIELD

The present invention relates to a thulium-containing fluorescent substance for a white light emitting diode (LED) represented by a following chemical formula 1, $$(M_{1-x-y}Eu_xTm_y)_2SiO_4 \qquad \text{[Chemical Formula 1]}$$

where M is a divalent cation metal including Sr or Ba, with $0.005 \leq x \leq 0.05$ and $0.005 \leq y \leq 0.05$.

Furthermore, the present invention is to provide a method of manufacturing a fluorescent substance for a white light-emitting diode of the above chemical formula 1, that is, for a yellow fluorescent substance, wherein a silicate-based compound is used as a host material, the method comprising the steps of adding europium oxide ($Eu_2O_3$) and thulium oxide ($Tm_2O_3$) to this substance and mixing them together; thermally treating a material obtained in the mixing step in a temperature between 1,000~4,500° C.; and post-processing including a pulverizing process.

BACKGROUND ART

A white LED is one of next-generation light-emitting elements which can replace the existing general lights, and the white light-emitting diode has been manufactured by mixing three-primary-colored light-emitting diodes since red, green and blue light-emitting diodes having a high luminance began to be commercialized.

Due to a remarkable development of technology, a yellow fluorescent substance can be excited by a blue light source having a wavelength of 460 nm using a blue light-emitting diode having sufficient excited energy, and thus a white light-emitting diode can be manufactured by mixing blue and yellow.

DISCLOSURE

Technical Problem

However, in order to implement a white light-emitting diode having high luminance, it is required to provide a yellow fluorescent substance having high luminance excited by a blue light source generated from a blue light-emitting diode to emit a light.

Technical Solution

Accordingly, the present invention is made by taking the problem mentioned above into consideration, and a silicate-based fluorescent substance activated by europium, having low luminous efficiency, is doped by thulium as a co-activator under blue light source excitation, thereby providing a thulium-containing fluorescent substance for a white light emitting diode and a manufacturing method thereof to enhance light-emitting efficiency even under blue light source excitation.

Advantageous Effects

The silicate-based yellow fluorescent substance according to the present invention is sufficiently excited by a blue light source generated by a blue LED to exhibit a yellow emission, and especially the luminous intensity is superior, thereby having an effect suitable for a white LED, and also an effect of superior yellow-emitting luminance can be obtained by adding europium oxide ($Eu_2O_3$) and thulium oxide ($Tm_2O_3$) as an activator.

DESCRIPTION OF DRAWINGS

The above and other objects, features and advantages of the present invention will become apparent from the following description of preferred embodiments given in conjunction with the accompanying drawings, in which:

FIG. 1 is a scanning electronic microscopic view of a yellow fluorescent substance obtained in an Example 2 of the present invention, FIG. 2 is a luminous intensity graph in case where an amount of added europium is changed in an Example 3 of the present invention, FIG. 3 is a resultant emission spectrum graph in an Example 4 of the present invention, FIG. 4 is a luminous intensity graph for a white LED obtained in an Example 5 of the present invention, and FIG. 5 is a resultant light excitation spectrum graph of a fluorescent substance obtained in an Example 6 of the present invention.

BEST MODE

Hereinafter, the embodiments of the present invention will be described in detail with reference to accompanying drawings.

In order to achieve the above-mentioned object, the present invention is characterized to provide a thulium-containing fluorescent substance for a white light emitting diode represented by a following chemical formula 1, $$(M_{1-x-y}Eu_xTm_y)_2SiO_4 \qquad \text{[Chemical Formula 1]}$$

where M is a divalent cation metal including Sr or Ba, with $0.005 \leq x \leq 0.05$ and $0.005 \leq y \leq 0.05$.

Also, the present invention is to provide a method of manufacturing a yellow fluorescent substance of the above chemical formula 1, characterized in that a silicate-based compound is used as a parent substance, the method comprising the steps of adding europium oxide ($Eu_2O_3$) and thulium oxide ($Tm_2O_3$) to this substance and mixing them together; thermally treating a material obtained in the mixing step in a temperature between 1,000~1,500° C.; and post-processing including a pulverizing process.

Furthermore, the present invention is to provide a thulium-containing fluorescent substance for a white light emitting diode, characterized in that the fluorescent substance is represented by a following chemical formula 2, $$(M_{1-x-y-z-\alpha}Eu_xTm_yA_zR_\alpha)_2SiO_4 \qquad \text{[Chemical Formula 2]}$$

where M is a divalent cation metal including Sr or Ba, and A is a univalent cation metal including Li or K with $0.00 \leq z \leq 0.05$, and R is a rare earth metal including Ce, Pr, Sm or Gd with $0.00 \leq \alpha \leq 0.05$.

The silicate-based yellow fluorescent substance according to the present invention is sufficiently excited by a blue light source generated by a blue LED to exhibit a yellow emission, and especially the luminous intensity is superior, thereby having an effect suitable for a white LED.

According to the present invention, in particular, it is characterized to obtain an effect of superior yellow-emitting luminance by adding europium oxide ($Eu_2O_3$) and thulium oxide ($Tm_2O_3$) as an activator.

Such a yellow fluorescent substance according to the present invention will be described in more detail as follows based on a manufacturing method thereof.

First, carbonate compound containing a divalent cation and silicon oxide ($SiO_2$) is added by europium oxide ($Eu_2O_3$) as an activator and thulium oxide ($Tm_2O_3$) as a co-activator to mix them.

At this time, 0.005-0.04 mol of the europium oxide, which is used as an activator, is added to a carbonate compound among fluorescent substance raw materials. There occurs a problem that it may not be a sufficient amount to function as an activator if the amount less than 0.005 mol is used, and the luminance may be reduced due to a concentration quenching phenomenon if more than 0.04 mol is used.

According to the present invention, furthermore, thulium oxide, which is a co-activator, is used together, and it will be an optimal amount when the molar ratio of Eu:Tm is 0.03:0.01.

The fluorescent substance raw materials and co-activator as described above were measured respectively to be a specific ratio according to a desired composition, and sufficiently mixed to be a uniform composition using a mixer, such as balling milling or agate mortar under ethanol solvent for an effective mixing. Then, the mixture was placed into an oven and dried at a temperature between 100-150° C. for 24 hours. The dried mixture was placed into a high-purity alumina boat and thermally treated at a temperature between 1,000-1,300° C. using an electric furnace, and then sufficiently pulverized. If thermal treatment temperature is higher than 1,300° C., there may be a problem that non-uniform growth of particles is caused due to an oversintering phenomenon to reduce the luminance, and if lower than 1,000° C., it may be not good because the phase formation property is inferior.

Photoluminescence (PL) was measured for this powder using a fluorescence spectrophotometer, and as a result a yellow fluorescent substance represented by the chemical formula 1, having a maximum emission peak at 560 nm, showing a strong emission spectrum in a range between 475-680 nm, and exhibiting a superior emission luminance, was obtained.

In this way, the thulium-containing silicate-based yellow fluorescent substance manufactured according to the present invention is excited by a blue light source generated by a blue LED to exhibit a yellow emission having superior luminous intensity, thereby having high luminance suitable for a white LED.

Hereinafter, it will be described in more detail through examples.

Example 1

Manufacture of Fluorescent Substance $(Sr_{0.75}Ba_{0.21}Eu_{0.03}Tm_{0.01})_2SiO_4$ With a ratio of 0.75 mol strontium carbonate, 0.21 mol barium carbonate, 0.03 mol europium oxide, 0.01 mol thulium oxide, and 1 mol silicon oxide, raw materials were measured to be mixed uniformly using an agate mortar. The mixed specimen is dried at 130° C. for 24 hours using an oven. The obtained mixture was placed into a high-purity alumina boat and the electric furnace was heated at 1,300° C. for 4 hours in a reducing atmosphere. The obtained material was placed into a distilled water and pulverized using ultra waves and a mixer, and then ball-milled to obtain a yellow fluorescent substance represented by $(Sr_{0.75}Ba_{0.21}Eu_{0.03}Tm_{0.01})_2SiO_4$.

Example 2

Surface Shape of Silicate-Based Yellow Fluorescent Substance to which Europium and Thulium are Added Similarly implemented as in the Example 1, but 0.76 mol of strontium carbonate and 0.03 mol of europium oxide were added respectively to obtain a yellow fluorescent substance represented by $(Sr_{0.76}Ba_{0.21}Eu_{0.02}Tm_{0.01})_2SiO_4$. Then, the obtained yellow fluorescent substance was observed by a scanning electronic microscope, and the surface shape is shown in FIG. 1.

FIG. 1 is a scanning electronic microscopic view of the yellow fluorescent substance obtained in an Example 2 of the present invention.

As shown in FIG. 1, it is confirmed that the silicate-based yellow fluorescent substance according to the present invention is particles having a size of 10-30 μm.

Example 3

Photoluminescence Intensity of Silicate-Based Yellow Fluorescent Substance According to the Europium Content For a yellow fluorescent substance represented by $(Sr_{0.79-x}Ba_{0.21}Eu_x)_2SiO_4$, photoluminescence was measured for the specimens in which an amount of added europium has been changed, and the result is shown in FIG. 2.

As shown in FIG. 2, it is confirmed that emission luminance gradually increased by adding europium to the yellow fluorescent substance of the invention, but emission luminance decreased due to a concentration quenching phenomenon in case where an amount of added europium is more than 0.0035 mol. Accordingly, it is confirmed that a range of added europium capable of exhibiting an especially superior emission luminance is 0.025-0.035 mol.

Example 4

Comparison of Emission Spectrum of Fluorescent Substance $(Sr_{0.76}Ba_{0.21}Eu_{0.03})_2SiO_4$ with Fluorescent Substance in which Thulium is Added to this Substance Emission spectrum was measured for the fluorescent substance $(Sr_{0.76}Ba_{0.21}Eu_{0.03})_2SiO_4$ obtained in the Example 3 and the fluorescent substance $(Sr_{0.76-y}Ba_{0.21}Eu_{0.03}Tm_y)_2SiO_4$, and the result is shown in FIG. 3.

As shown in FIG. 3, as europium and thulium were added by 0.03 mol and 0.01 mol respectively, the yellow fluorescent substance according to the present invention exhibits a yellow emission having a peak wavelength at 560 nm, and it is confirmed that the yellow fluorescent substance has a superior emission luminance compared with an emission spectrum of fluorescent substance $(Sr_{0.76}Ba_{0.21}Eu_{0.03})_2SiO_4$. Consequently, it is confirmed that europium ion ($Eu^{2+}$) works as an activator on fluorescent substance $(Sr_{0.76}Ba_{0.21}Eu_{0.03})_2SiO_4$ to exhibit a yellow emission, and thulium ion ($Tm^{2+}$), which has been added together with the europium ion, as a co-activator for transferring energy to the europium ion, greatly contributes to a yellow emission of silicate fluorescent substance. Since divalent thulium ion ($Tm^{2+}$) is a material which is unstable at room temperature and in air as well as has a high oxidizing power, it has a tendency to be re-oxidized to trivalent thulium ion ($Tm^{3+}$) in silicate environment. Because oxidizing power at this time is greater than the oxidizing power of europium ion from a divalent to a trivalent state, firstly thulium is oxidized and this delays the oxidation of europium ion, thereby increasing the lifetime as well as enhancing the stability of reduced europium ion due to this effect. Furthermore, substitution, surface defect, or the like in europium are controlled to help its crystal growth, and as a result it is expected to have an effect of increasing luminous intensity.

Example 5

Manufacture of a White LED Using Fluorescent Substance $(Sr_{0.75}Ba_{0.21}Eu_{0.03}Tm_{0.01})_2SiO_4$ Using fluorescent substance $(Sr_{0.75}Ba_{0.21}Eu_{0.03}Tm_{0.01})_2$ $SiO_4$ obtained in the Example 4, a white LED is manufactured, and the result is shown in FIG. 4.

As shown in FIG. 4, it is confirmed that the yellow fluorescent substance of the invention exhibits a superior yellow emission at 560 nm in a blue excited light of 465 nm, and the blue excited light and the yellow emission are combined to emit a white light.

Example 6

Manufacture of Fluorescent Substance $(Sr_{0.72}Ba_{0.21}Eu_{0.03}Tm_{0.01}Li_{0.02}Gd_{0.01})_2SiO_4$ In case of the Example 4, thulium exists as two types, both in divalent and trivalent state within a silicate fluorescent substance, and it increases lifetime and stability when re-oxidizing from a divalent to a trivalent state. At this time, however, thulium oxidized to a trivalent state may reduce luminous characteristics due to a charge valence difference from strontium, which is a divalent cation. Accordingly, there may be a method of adding univalent lithium for a method of reducing the charge quantity of thulium, which has been re-oxidized to a trivalent state, again to a divalent state. Through transferring electrons between thulium, which has been re-oxidized to a trivalent state, and univalent lithium, the charge quantity of strontium, valium, europium, thulium, and lithium consisting of a cationic group, is all controlled to a divalent level, thereby facilitating energy transfer. Accordingly, through the site control, good crystal growth, and increased energy transfer of europium by adding thulium and lithium in proportioning materials, luminous intensity can be enhanced and the stability of lifetime and crystal can be induced.

Light excitation spectrum was measured for fluorescent substance $(Sr_{0.72}Ba_{0.21}Eu_{0.03}Tm_{0.01}Li_{0.02}Gd_{0.01})_2SiO_4$ obtained in the Example 6 and $(Sr_{0.76}Ba_{0.21}Eu_{0.03})_2SiO_4$ to which co-activators such as thulium or the like is not added, and the result is shown in FIG. 5.

As shown in FIG. 5, it can be seen that the luminous intensity of fluorescent substance (a) $(Sr_{0.72}Ba_{0.21}Eu_{0.03}Tm_{0.01}Li_{0.02}Gd_{0.01})_2SiO_4$ increases more than 15% compared with fluorescent substance (b) to which a co-activator such as Tm or the like is not added in vicinity of 450 nm, which is a blue LED light source.

INDUSTRIAL APPLICABILITY

As stated above, according to the present invention, by adding europium as an activator and thulium as a co-activator to a silicate-based fluorescent substance, it has high luminance as well as exhibits a yellow emission under excitation of a blue light source having a wavelength of 460 nm generated from a blue LED, and therefore it is useful as a yellow fluorescent substance applicable to fluorescent substance for a white LED. Moreover, by adding lithium, it can prevent the variation of charge quantity caused by the re-oxidation of thulium, and increase lifetime, thereby enhancing the overall stability of crystal.

The invention claimed is:

1. A thulium-containing fluorescent substance for a white light emitting diode, characterized in that the fluorescent substance is represented by a following chemical formula 1:

$(M_{1-x-y}Eu_xTM_y)_2SiO_4$ where M is a mixture of Sr and Ba, $0.005 \leq x \leq 0.05$ and $0.005 \leq y \leq 0.05$, wherein the ratio of x and y is in a range of 2:1-3:1.

2. A method of manufacturing the thulium-containing fluorescent substance for a white light emitting diode of claim 1 comprising the steps of:
(a) mixing strontium carbonate, barium carbonate, europium oxide ($Eu_2O_3$), thulium oxide ($Tm_2O_3$) and silicon oxide ($SiO_2$);
(b) thermally treating the mixture obtained in step (a) at a temperature between 1,000° C. and 1,500° C. to obtain a sintered product; and
(c) pulverizing the sintered product obtained in step (b) to give the thulium-containing fluorescent substance.

3. A thulium-containing fluorescent substance for a white light emitting diode, characterized in that the fluorescent substance is represented by a following chemical formula 2:

$(M_{1-x-y-z-\alpha}Eu_xTm_yA_zR_\alpha)_2SiO_4$ where M is a mixture of Sr and Ba; A is Li, K or a mixture thereof with $0.00 < z \leq 0.05$; R is Ce, Pr, Sm, Gd or a mixture thereof with $0.00 < \alpha \leq 0.05$; $0.005 \leq x \leq 0.05$ and $0.005 \leq y \leq 0.05$, wherein the ratio of x and y is in a range of 2:1-3:1.

4. A method of manufacturing the thulium-containing fluorescent substance for a white light emitting diode of claim 3 comprising the steps of:
(a) mixing strontium carbonate; barium carbonate; europium oxide ($Eu_2O_3$); thulium oxide ($Tm_2O_3$); silicon oxide ($SiO_2$); lithium carbonate, potassium carbonate or a mixture thereof; and an oxide of Ce, Pr, Sm or Gd, or a mixture thereof,
(b) thermally treating the mixture obtained in step (a) at a temperature between 1,000° C. and 1,500° C. to obtain a sintered product, and
(c) pulverizing the sintered product obtained in step (b) to give the thulium-containing fluorescent substance.

* * * * *